(12) United States Patent
Hirase

(10) Patent No.: US 10,305,058 B2
(45) Date of Patent: May 28, 2019

(54) ELECTROLUMINESCENT DEVICE AND METHOD FOR PRODUCING SAME

(71) Applicant: Sharp Kabushiki Kaisha, Sakai, Osaka (JP)

(72) Inventor: Takeshi Hirase, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 52 days.

(21) Appl. No.: 15/525,263

(22) PCT Filed: Nov. 4, 2015

(86) PCT No.: PCT/JP2015/081021
§ 371 (c)(1),
(2) Date: May 8, 2017

(87) PCT Pub. No.: WO2016/076170
PCT Pub. Date: May 19, 2016

(65) Prior Publication Data
US 2018/0301654 A1 Oct. 18, 2018

(30) Foreign Application Priority Data
Nov. 11, 2014 (JP) ................. 2014-229239

(51) Int. Cl.
*H01L 51/50* (2006.01)
*H01L 51/52* (2006.01)
*H01L 27/32* (2006.01)
*H05B 33/04* (2006.01)
*H01L 51/56* (2006.01)

(52) U.S. Cl.
CPC ...... *H01L 51/5036* (2013.01); *H01L 27/3262* (2013.01); *H01L 27/3276* (2013.01); *H01L 51/5218* (2013.01); *H01L 51/5234* (2013.01); *H01L 51/5253* (2013.01); *H01L 51/56* (2013.01); *H05B 33/04* (2013.01)

(58) Field of Classification Search
CPC ............... H01L 51/524; H01L 51/5253; H01L 51/5036; H01L 27/3262; H01L 27/3276; H05B 33/04
See application file for complete search history.

(56) References Cited

U.S. PATENT DOCUMENTS

| 6,872,473 | B2* | 3/2005 | Song | ................... | H01L 51/5253 |
| | | | | | 257/100 |
| 7,642,715 | B2* | 1/2010 | Hayashi | .............. | H01L 51/5246 |
| | | | | | 313/500 |
| 2005/0110020 | A1 | 5/2005 | Hayashi et al. | | |

(Continued)

FOREIGN PATENT DOCUMENTS

| JP | 2005-251721 A | 9/2005 |
| JP | 2012-214023 A | 11/2012 |
| WO | 2006/067952 A | 6/2006 |

*Primary Examiner* — Xuemei Zheng
(74) *Attorney, Agent, or Firm* — ScienBiziP, P.C.

(57) ABSTRACT

An organic EL display device includes a TFT substrate (substrate) and an organic EL element (electroluminescent element) provided on the TFT substrate, a first leveled layer provided covering the organic EL element; an inorganic layer provided on the first leveled layer; and a second leveled layer provided on the inorganic layer. Further, the first and second leveled layers are configured by diisocyanate.

12 Claims, 7 Drawing Sheets

(56) References Cited

U.S. PATENT DOCUMENTS

2005/0142382 A1* 6/2005 Menda ................ H01L 51/5246
                                                    428/690
2014/0000699 A1* 1/2014 Akaike ................ B32B 27/325
                                                    136/256

* cited by examiner

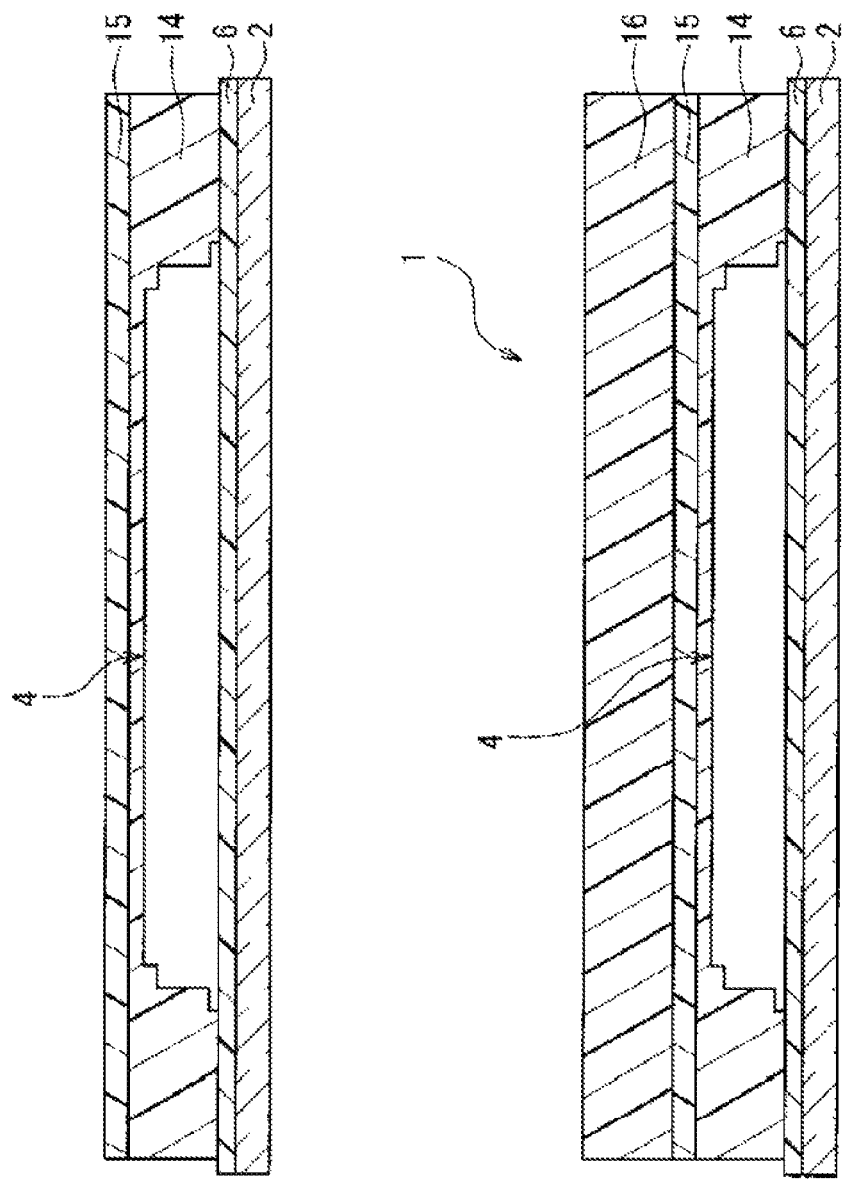

ELECTROLUMINESCENT DEVICE AND METHOD FOR PRODUCING SAME

TECHNICAL FIELD

The present disclosure relates to an electroluminescent device having an electroluminescent (EL) element and to a method for producing the electroluminescent device.

BACKGROUND ART

In recent years, flat panel displays have been utilized in various products and fields, and there are demands for flat panel displays having even larger sizes, even higher picture quality, and even lower power consumption.

In view of such circumstances, organic electroluminescent (referred to as EL below) display devices provided with organic EL elements utilizing the electroluminescence of organic materials are attracting a high degree of attention as flat panel displays, due to their excellent qualities, such as low voltage driving, high responsiveness, and self-luminosity, while being in a completely solid state.

For example, in an active-matrix organic EL display device, a thin film organic EL element is provided on a substrate, on which a thin film transistor (TFT) is provided. In the organic EL element, organic EL layers including a light emitting layer are layered between a pair of electrodes. One of the pair of electrodes is connected to the TFT. Then, image display is performed by applying a voltage between the pair of electrodes and causing the light emitting layer to emit light.

Further, in this kind of conventional organic EL display device described above, in order to prevent deterioration of the organic EL element caused by moisture or oxygen, a sealing film is known to be provided for the organic EL element.

In addition, in this kind of conventional organic EL display device described above, as disclosed in PTL 1 (see below), for example, it is proposed to provide, on the organic EL element, a gas barrier thin film layered body (sealing film) in which a stress relaxation film (an organic film) and an inorganic film are alternately layered. Then, in this conventional organic EL display device, it is said that deterioration of the organic EL element caused by moisture or oxygen can be inhibited by the sealing film.

CITATION LIST

Patent Literature
PTL 1: WO 2006/067952

SUMMARY

Technical Problem

However, in the conventional organic EL display device described above, it is not always possible to prevent the permeation of moisture into the organic EL element (electroluminescent element). Thus, in this conventional organic EL display device, a problem occurs in which the deterioration of the organic EL element caused by moisture permeation cannot be prevented, and reliability declines.

More specifically, in the conventional organic EL display device described above, when an organic film is formed on the organic EL element, moisture is sometimes included in the organic film, and this moisture reaches the organic EL element, thus resulting in deterioration of the organic EL element. On the other hand, when an inorganic film is formed on the organic EL element, defects such as pin holes or cracks occur in this inorganic film, interfacial peeling occurs due to film stress, and moisture permeates through the inorganic film, thus resulting in the deterioration of the organic EL element.

In light of the foregoing, it is an object of the present disclosure to provide an electroluminescent device offering excellent reliability that can improve barrier properties for an electroluminescent element and can significantly suppress the occurrence of deterioration in the electroluminescent element caused by moisture, and a production method for the electroluminescent device.

Solution to Problem

To achieve the above object, an electroluminescent device according to an aspect of the present invention includes a substrate, an electroluminescent element provided on the substrate, a first leveled layer provided covering the electroluminescent element, an inorganic layer provided on the first leveled layer, and a second leveled layer provided on the inorganic layer.

The first and second leveled layers are configured by diisocyanate.

In the electroluminescent device configured as described above, the first leveled layer is provided covering the electronic luminescent element. Further, the inorganic layer and the second leveled layer are sequentially formed on the first leveled layer. In addition, the first and second leveled layers are configured by diisocyanate. In this way, in contrast to the conventional example described above, the electroluminescent device offering excellent reliability can be configured that can improve the barrier properties for the electroluminescent element and can significantly suppress the occurrence of deterioration in the electroluminescent element caused by moisture.

Further, in the above-described electroluminescent device, a liquid repellent layer may be provided covering the first leveled layer, the inorganic layer, and the second leveled layer.

In this case, the permeation of moisture present outside the electroluminescent device can be inhibited to the utmost extent.

Further, in the above-described electroluminescent device, fluorine is preferably used in the liquid repellent layer.

In this case, the liquid repellent layer capable of reliably suppressing the permeation of moisture can be easily formed.

Further, in the above-described electroluminescent device, a thickness of a peripheral portion of the first leveled layer is preferably not less than 1000 nm.

In this case, the barrier properties with respect to the electroluminescent element can be reliably improved.

Further, in the above-described electroluminescent device, a thickness of the inorganic layer is preferably not less than 100 nm.

In this case, an adverse impact of moisture on the electroluminescent element can be more reliably inhibited.

Further, in the above-described electroluminescent device, a thickness of the second leveled layer is preferably not less than 1000 nm.

In this case, the barrier properties with respect to the electroluminescent element can be reliably improved. At the same time, even if cracks or pin holes are formed in the inorganic layer, a deterioration in the barrier properties can be reliably inhibited.

A method for producing an electroluminescent device according to an aspect of the present invention is a method for producing an electroluminescent device including a substrate and an electroluminescent element provided on the substrate. The method includes: forming a first leveled layer covering the electroluminescent element, the first leveled layer being configured by diisocyanate; forming an inorganic layer on the first leveled layer; and forming a second leveled layer on the inorganic layer, the second leveled layer being configured by diisocyanate.

In the method for producing the electroluminescent device configured as described above, by the forming a first leveled layer, the first leveled layer configured by diisocyanate is formed covering the electronic luminescent element. Further, by the forming an inorganic layer, the inorganic layer is formed on the first leveled layer. In addition, by the forming a second leveled layer, the second leveled layer configured by diisocyanate is formed on the inorganic layer. In this way, in contrast to the conventional example described above, the electroluminescent device offering excellent reliability can be configured that can improve the barrier properties for the electroluminescent element and can significantly suppress the occurrence of deterioration in the electroluminescent element caused by moisture.

Further, in the above-described method for producing the electroluminescent device, forming a liquid repellent layer may be performed that covers the first leveled layer, the inorganic layer, and the second leveled layer, after the forming a second leveled layer.

In this case, the permeation of moisture present outside the electroluminescent device can be inhibited to the utmost extent.

Further, in the method described above for producing the electroluminescent device, the forming a liquid repellent layer preferably includes forming a liquid repellent layer using fluorine by using one of microwaves and plasma waves.

In this case, the liquid repellent layer capable of reliably suppressing the permeation of moisture can be easily formed.

Advantageous Effects of Invention

According to an aspect of the present invention, an electroluminescent device offering excellent reliability and a method for producing the electroluminescent device can be provided. As a result, the electroluminescent device can improve barrier properties for an electroluminescent element and can significantly suppress the occurrence of deterioration in the electroluminescent element caused by moisture.

BRIEF DESCRIPTION OF DRAWINGS

FIG. 4A and FIG. 4B illustrate a series of main production processes.

FIG. 5A and FIG. 5B are diagrams illustrating main production processes of the organic EL display device described above, where FIG. 5A and FIG. 5B illustrate a series of main production processes performed after the production process illustrated in FIG. 4B.

DESCRIPTION OF EMBODIMENTS

Below, preferred embodiments of an electroluminescent device and a method for producing the electroluminescent device according to an aspect of the present invention will be described with reference to the drawings. Note that, in the following description, examples will be described when the aspect of the present invention is applied to an organic EL display device. Further, dimensions in each of the drawings of constituent members do not accurately represent dimensions of actual constituent members, nor dimensional ratios and the like of each of constituent members.

First Embodiment

Figure 1:
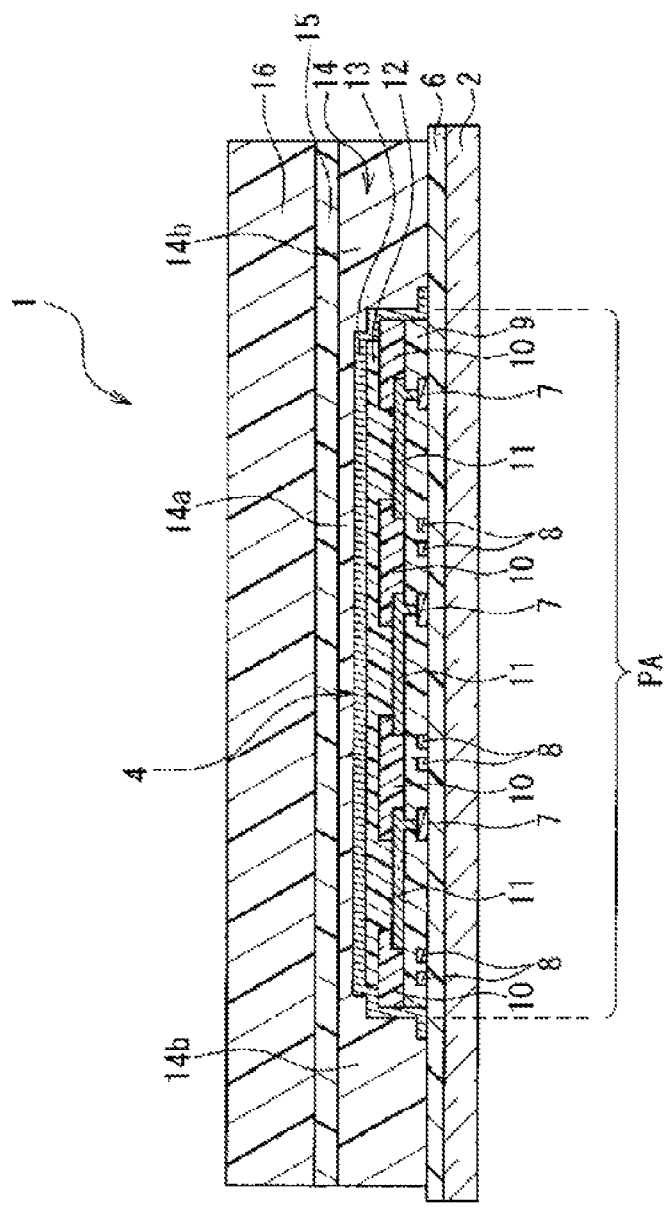
FIG. 1 is a cross-sectional view illustrating a cross section of an organic EL display device according to a first embodiment of the present invention.

FIG. 1 is a cross-sectional view illustrating a cross section of an organic EL display device according to a first embodiment of the present invention. In FIG. 1, an organic EL display device 1 of the present embodiment is provided with a TFT substrate 2 as a substrate, and an organic EL element 4 as an electroluminescent element provided on the TFT substrate 2.

Further, in the organic EL display device 1 of the present embodiment, the organic EL element 4 configures a rectangular pixel area PA that has a plurality of pixels (including a plurality of sub pixels). Further, the organic EL element 4 is sealed by a first leveled layer 14, an inorganic layer 15, and a second leveled layer 16 (to be described in detail later). In addition, the pixel area PA described above configures a display portion of the organic EL display device 1, and displays information. Specifically, in the pixel area PA, as will be described in more detail later, a plurality of pixels (a plurality of sub pixels) are arranged in a matrix shape, and the organic EL element 4 has a configuration in which each of the sub pixels emits light, as a result, the organic EL element 4 displays information.

Further, in FIG. 1, the TFT substrate 2 is configured by, for example, a glass material, or a flexible (bendable) film or the like. Further, a foundation film (an insulating film) 6 is provided on the TFT substrate 2 covering a whole surface thereof. In addition, as illustrated in FIG. 1, in the organic EL display device 1, a thin film transistor (TFT) 7 is provided on the foundation film 6 for each of the sub pixels of the pixel area PA. Further, wires 8, which include a plurality of source lines (signal wires) and a plurality of gate lines provided in a matrix shape, are formed on the foundation film 6. A source driver and a gate driver (not illustrated) are connected to each of the source lines and the gate lines, and drive the TFT 7 of each of the sub pixels in response to image signals input from an external source. Further, the TFT 7 functions as a switching element that controls the light emission of the corresponding sub pixel, and is configured to control the light emission in the stub pixel of each of the colors of red (R), green (G), and blue (B) configured by the organic EL element 4.

Note that the foundation film 6 is designed to inhibit a deterioration in performance of the TFT 7 resulting from impurity diffusion from the TFT substrate 2 to the TFT 7, and if this type of deterioration is not a matter for concern, installation of the foundation film 6 may be omitted.

In addition, when the TFT substrate 2 is a flexible film, to inhibit deterioration of the TFTs 7 or the organic EL element 4 due to penetration (permeation) of moisture or oxygen from the outside, a moisture-proof layer configured by an inorganic film, such as silicon nitride or silicon oxinitride, may be formed in advance on the TFT substrate 2.

As illustrated in FIG. 1, an interlayer insulating film 9, edge covers 10, and first electrodes 11 of the organic EL element 4 are formed on the TFT substrate 2. The interlayer insulating film 9 also functions as a leveled film, and is provided on the foundation film 6 while covering the TFTs 7 and the wires 8. The edge cover 10 is formed on the interlayer insulating film 9 while covering a pattern end portion of the first electrode 11. Further, the edge cover 10 is also configured to function as an insulating layer to inhibit a short circuit between the first electrode 11 and a second electrode 13 to be described later. In addition, the first electrode 11 is connected to the TFT 7 via a contact hole formed in the interlayer insulating film 9.

Further, an opening of the edge cover 10, namely, a portion at which the electrode 11 is exposed, substantially configures a light-emitting region of the organic EL element 4, and, as described above, the organic EL display device 1 of the present embodiment is configured to be able to perform full color display by the light emission of any one of the RGB colored lights. In addition, the organic EL display device 1 of the present embodiment configures an active-matrix display device that has the thin film transistors (TFTs) 7.

Further, as illustrated in FIG. 1, an organic EL layer 12 and the second electrode 13 are formed on the first electrodes 11, and the organic EL element 4 is configured by the first electrodes 11, the organic EL layer 12, and the second electrode 13. Specifically, the organic EL element 4 is, for example, a light-emitting element capable of emitting light at high luminance as a result of low-voltage DC power driving, and is provided with the first electrodes 11, the organic EL layer 12, and the second electrode 13.

More specifically, when the first electrodes 11 are positive electrodes, from the first electrode 11 side, a hole injecting layer, a hole transport layer, a light-emitting layer, an electron transport layer, an electron injecting layer and the like are layered (not illustrated) as the organic EL layer 12, and the second electrode 13 is further formed as a negative electrode. Further, in addition to the following description, a configuration may be adopted in which a single layer may have two or more functions, such as the hole infecting layer that also functions as the hole transport layer. In addition, in the organic EL layer 12, a carrier blocking layer or the like can be inserted as necessary.

Meanwhile, when the second electrode 13 is the positive electrode, the order of layers in the organic EL layer 12 is the reverse to the order described above.

Further, when each of the first electrodes 11 is configured by a transparent electrode or a translucent electrode, and the second electrode 13 is configured by a reflective electrode, the organic EL display device 1 is a bottom-emitting type that emits light from the TFT substrate 2 side. Specifically, in this bottom-emitting organic EL display device 1, the surface of each of the first electrodes 11 on the TFT substrate 2 side configures a substantial light emitting surface of the organic EL element 4, and is configured to emit light to the outside.

In contrast, when each of the first electrodes 11 is configured by a reflective electrode, and the second electrode 13 is configured by a transparent electrode or a translucent electrode, the organic EL display device 1 is a top-emitting type that emits light from the second leveled layer 16. Specifically, in this top-emitting organic EL display device 1, the surface of each of the first electrodes 11 on the second leveled layer 16 side configures the substantial light emitting surface of the organic EL element 4, and is configured to emit light to the outside.

Further, as described above, in the organic EL display device 1 of the present embodiment, the organic EL element 4 is sealed by the first leveled layer 14, the inorganic layer 15, and the second leveled layer 16. Then, in the organic EL display device 1 of the present embodiment, the first leveled layer 14, the inorganic layer 15, and the second leveled layer 16 inhibit moisture, oxygen or the like from penetrating (permeating) from the outside, and thus inhibit the deterioration of the organic EL element 4.

More specifically, the first leveled layer 14 is provided covering the organic EL element 4. Further, the first leveled layer 14 is configured by diisocyanate. In addition, the top surface of the first leveled layer 14 is configured so as to be flat, and, as illustrated in FIG. 1, in the first leveled film 14, a thickness of a peripheral portion (at least a portion on the outer side of the pixel area PA) 14b is set to be a larger value (a thicker value) than a thickness of a central portion (at least a portion that is the pixel area PA) 14a.

More specifically, in the first leveled layer 14, the thickness of the central portion 14a is set to 100 nm or greater, for example. Meanwhile, the thickness of the peripheral portion 14b is set to 1000 nm or greater, for example.

Silicon nitride, silicon oxide, silicon oxinitride, aluminum oxide or the like are used in the inorganic layer 15, for example. Further, the inorganic layer 15 is configured to have a substantially uniform thickness on the first leveled layer 14, and a thickness of the inorganic layer 15 is set to 100 nm or greater, for example.

Further, the second leveled layer 16 is configured by diisocyanate. Further, the second leveled layer 16 is configured to have a substantially uniform thickness on the inorganic layer 15, and a thickness of the second leveled layer 16 is set to 1000 nm or greater, for example.

Further, in the organic EL display device 1 of the present embodiment, the first leveled layer 14 made of diisocyanate is provided on the side of the organic EL element 4, and thus, an adverse impact of moisture on the organic EL element 4 can be more reliably suppressed due to the characteristics, of the first leveled layer 14, that trap (capture) moisture. Further, since the first leveled layer 14 has a high degree of flatness, the inorganic layer 15 and the second leveled layer 16 that are sequentially layered on the first leveled layer 14 can be formed with a high degree of accuracy. In addition, hardening shrinkage of the first leveled layer 14 does not easily occur, and thus, little stress, which causes an adverse impact on the organic EL element 4, is imparted. As a result, damage caused by the hardening shrinkage in the organic EL element 4 can be suppressed to the utmost extent.

Further, since the inorganic layer 15 is provided, the permeation of moisture from the outside of the organic EL display device 1 can be significantly inhibited, and the adverse impact of moisture on the organic EL element 4 can be suppressed.

In addition, since the second leveled layer 16 is provided, barrier properties with respect to the organic EL element 4 can be improved, and at the same time, even if cracks or pin holes are formed in the inorganic layer 15, a deterioration in the barrier properties can be inhibited.

Figure 2:
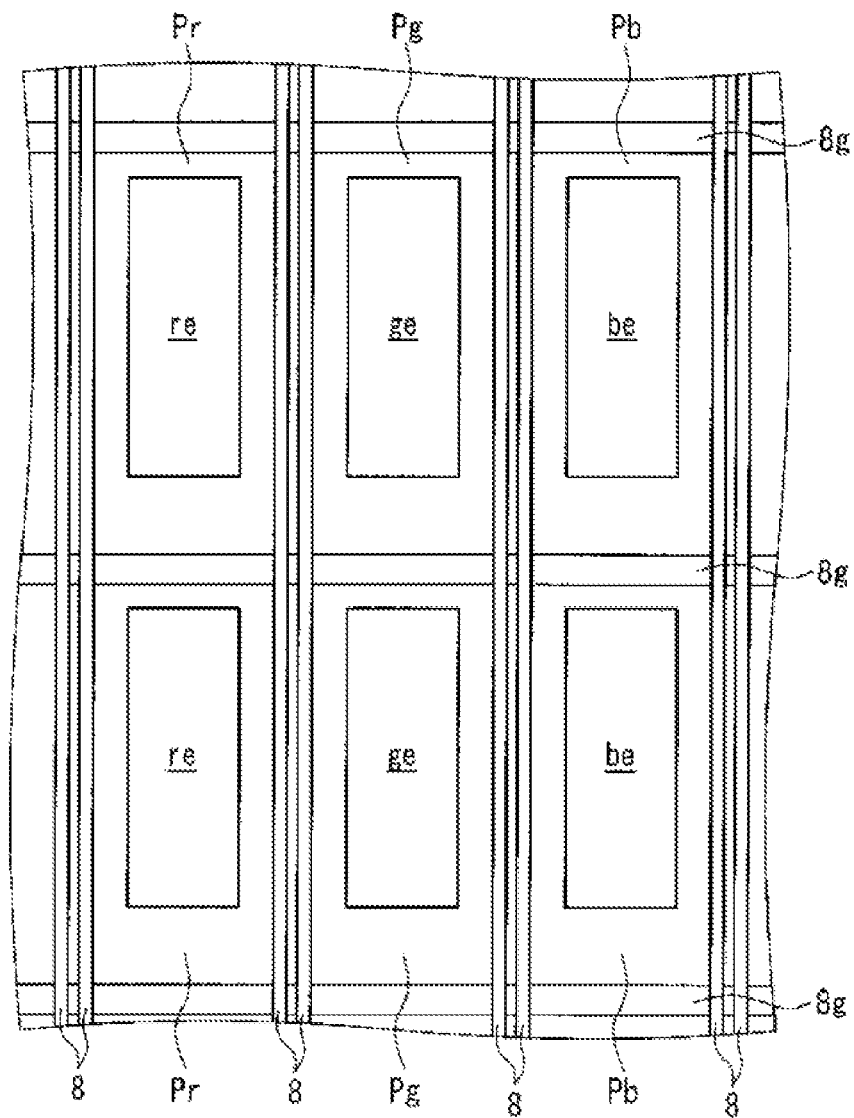
FIG. 2 is an enlarged plan view illustrating a pixel configuration of the organic EL display device described above.

Next, with reference to FIG. 2, the pixel area PA of the organic EL display device 1 of the present embodiment will be specifically described.

FIG. 2 is an enlarged plan view illustrating a pixel configuration of the organic EL display device described above.

Figure 3:
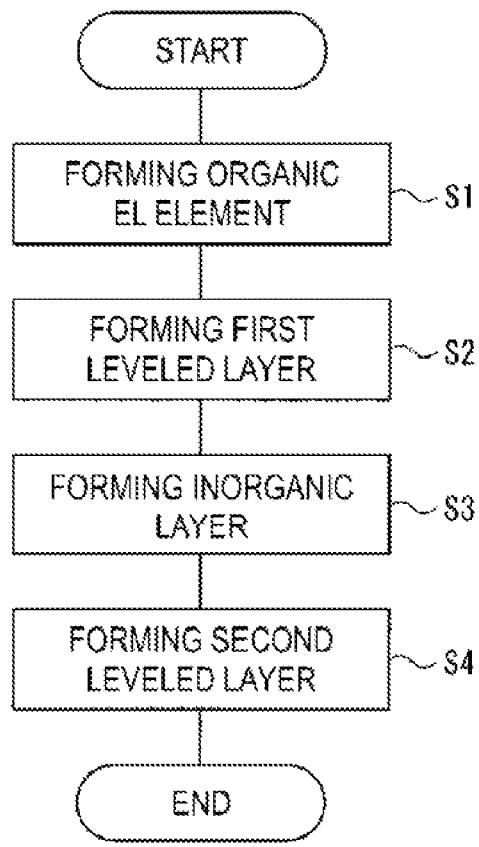
FIG. 3 is a flowchart illustrating a production process of the organic EL display device described above.

As illustrated in FIG. 2, in the organic EL display device 1 of the present embodiment, in the pixel area PA (FIG. 1), red, green, and blue sub pixels Pr, Pg, and Pb (hereinafter referred to collectively as sub pixels P) that respectively emit red (R) light, green (G) light, and blue (B) light are provided in a matrix shape. Specifically, the plurality of sub pixels P are each partitioned by two of the wires 8 and a gate line 8g connected to a gate of the TFT 7. More specifically, with respect to a pixel area of each of the sub pixels P, a dimension in the left-right direction in FIG. 3 is a dimension between a center line of the two wires 8 disposed close to each other and a center line of the two wires 8 that are adjacent, in the left-right direction in FIG. 2, to the two wires 8 disposed close to each other. Further, a dimension in the up-down direction in FIG. 2 is a dimension between centers of the two gate lines 8g that are adjacent to each other. Further, a surface area of the pixel area of each of the sub pixels P is defined by the left-right dimension and the up-down dimension in the above-described FIG. 2.

Further, in the pixel area PA, a single pixel is configured by a set of the red, green, and blue sub pixels Pr, Pg, and Pb.

Further, in the red sub pixel Pr, a portion exposed from an opening re of the edge cover 10 configures an actual light-emitting region of the red sub pixel Pr. Similarly, in the green sub pixel Pg, a portion exposed from an opening ge of the edge cover 10 configures an actual light-emitting region of the green sub pixel Pg, and in the blue sub pixel Pb, a portion exposed from an opening be of the edge cover 10 configures an actual light-emitting region of the blue sub pixel Pb.

Next, with reference to FIG. 3 to FIG. 5B, the method for producing the organic EL display device 1 of the present embodiment will be specifically described.

FIG. 3 is a flowchart illustrating a production process of the above-described organic EL display device. FIG. 4A and FIG. 4B are diagrams illustrating main production processes of the organic EL display device described above, where FIG. 4A and FIG. 4B illustrate a series of main production processes. FIG. 5A and FIG. 5B are diagrams illustrating main production processes of the organic EL display device described above, where FIG. 5A and FIG. 5B illustrate a series of main production processes performed after the production process illustrated in FIG. 4B.

Figure 4A:
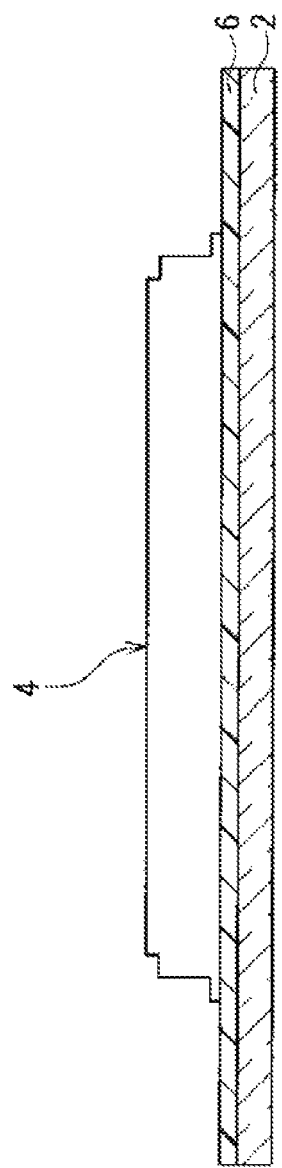
FIG. 4A and FIG. 4B are diagrams illustrating main production processes of the organic EL display device described above, where

As illustrated in step S1 in FIG. 3, in the organic EL display device 1 of the present embodiment, first, a process for forming an organic EL element is performed to form the organic EL element 4 on the TFT substrate 2. In the process for forming an organic EL element, as illustrated in FIG. 4A, the structural elements of the organic EL element 4, such as the TFTs 7 and the wires 8, are sequentially formed on the foundation film 6 on the TFT substrate 2.

Figure 4B:
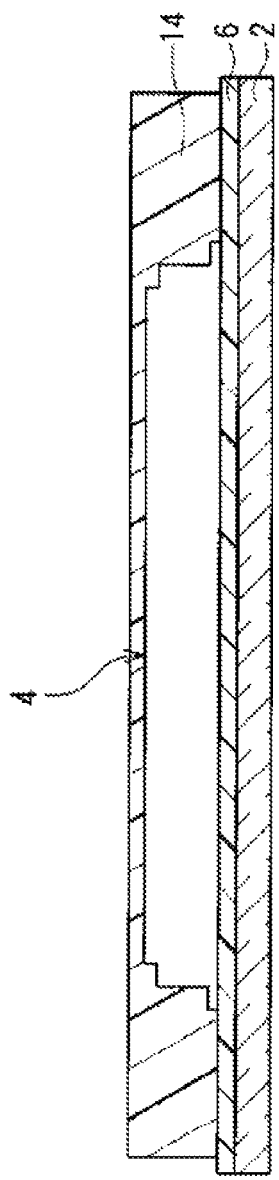

Next, as illustrated in step S2 in FIG. 3, a process for forming a first leveled layer is performed to form, on the organic EL element 4, the first leveled layer 14 configured from diisocyanate, so as TO cover the organic EL element 4. In the process for forming a first leveled layer, an evaporation method such as the electron beam (EB) evaporation method, or CVD is used, for example, to form the first leveled layer 14. In this way, as illustrated in FIG. 4B, the first leveled layer 14 is formed covering the organic EL element 4 on the foundation film 6.

Next, as illustrated in step S3 in FIG. 3, a process for forming an inorganic layer is performed to form the inorganic layer 15 on the first leveled layer 14. In the process for an inorganic layer, sputtering or CVD is used, for example, to form the inorganic layer 15. In this way, as illustrated in FIG. 5A, the inorganic layer 15 is formed on the first leveled layer 14.

Next, as illustrated in step S4 in FIG. 3, a process for forming a second leveled layer is performed to form, on the inorganic layer 15, the second leveled layer 16 configured from diisocyanate. In the process for forming a second leveled layer, an evaporation method such as the electron beam (EB) evaporation method, or CVD is used, for example, to form the second leveled layer 16. In this way, as illustrated in FIG. 5B, the second leveled layer 16 is formed on the inorganic layer 15, and the organic EL display device 1 is completed.

In the organic EL display device 1 of the present embodiment configured as described above, the first leveled layer 14 is provided covering the organic EL element (electronic luminescent element) 4. Further, the inorganic layer 15 and the second leveled layer 16 are sequentially formed on the first leveled layer 14. In addition, the first and second leveled layers 14 and 16 are configured by diisocyanate. In this way, in the present embodiment, in contrast to the above-described conventional example, the barrier properties with respect to the organic EL element 4 can be improved, and the organic EL display device (electroluminescent device) 1 offering excellent reliability can be configured to significantly suppress the occurrence of deterioration of the organic EL element 4 caused by moisture.

Further, in the present embodiment, the thickness of the peripheral portion of the first leveled layer 14 is 1000 nm or greater, and thus, the barrier properties with respect to the organic EL element 4 can be reliably improved.

Further, in the present embodiment, the thickness of the inorganic layer 15 is 100 nm or greater, and thus, the adverse impact of moisture on the organic EL element 4 can be more reliably inhibited.

Further, in the present embodiment, the thickness of the second leveled layer 16 is 1000 nm or greater, and thus, the barrier properties with respect to the organic EL element 4 can be reliably improved. At the same time, even if cracks or pin holes are formed in the inorganic layer 15, a deterioration in the barrier properties can be reliably inhibited.

Second Embodiment

Figure 6:
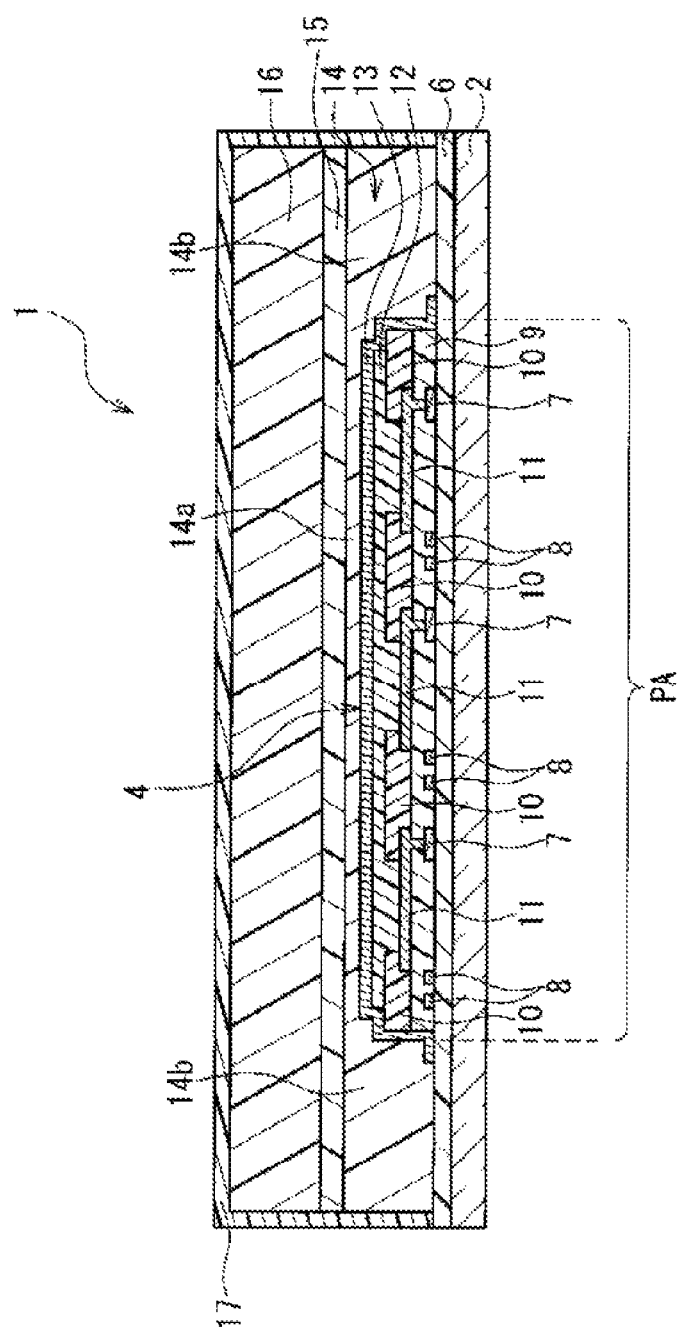
FIG. 6 is a cross-sectional view illustrating a cross section of the organic EL display device according to a second embodiment of the present invention.

FIG. 6 is a cross-sectional view illustrating a cross section of the organic EL display device according to a second embodiment of the present invention.

In the drawings, a main point of difference between the present embodiment and the first embodiment described above is that a liquid repellent layer is provided covering a first leveled layer, an inorganic layer, and a second leveled layer. Note that elements that are the same as those of the above-described first embodiment are denoted by the same reference signs, and a duplicated description thereof is omitted.

Specifically, as illustrated in FIG. 6, in the organic EL display device 1 of the present embodiment, a liquid repellent layer 17 is provided covering the first leveled layer, the inorganic layer, and the second leveled layer. Further, fluorine is used in the liquid repellent layer 17, for example, and a liquid repellent layer 17 exhibits water-repelling properties against moisture from the outside of the organic EL display device 1, thus inhibiting the permeation of moisture to the utmost extent.

Figure 7:
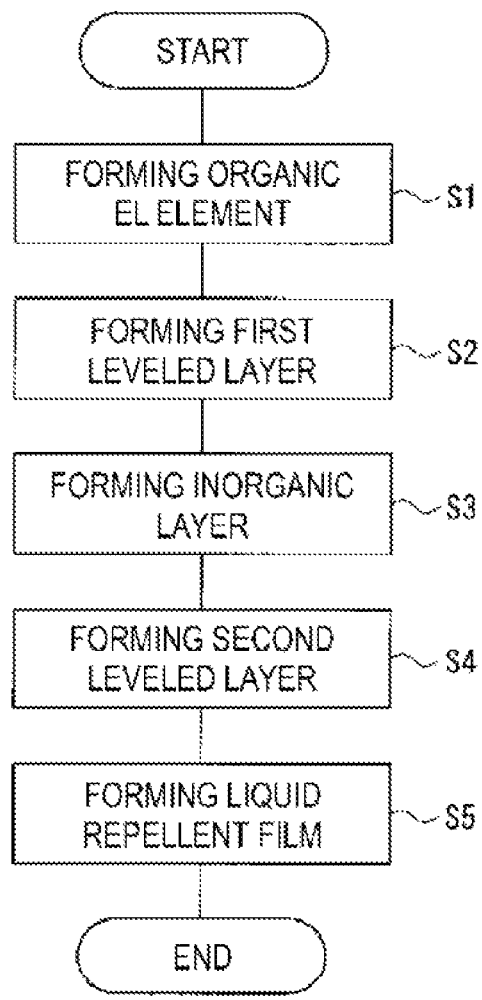
FIG. 7 is a flowchart illustrating a production process of the organic EL display device illustrated in FIG. 6.

Next, using FIG. 7, the method for producing the organic EL display device 1 of the present embodiment will be specifically described.

FIG. 7 is a flowchart illustrating a production process of the organic EL display device illustrated in FIG. 6.

As illustrated in step S5 in FIG. 7, after the process for forming a second leveled layer has been performed, a process for forming a liquid repellent layer is performed to form the liquid repellent layer 17 so as to cover the first leveled layer 14, the inorganic layer 15, and the second leveled layer 16. In the process for forming a liquid repellent layer, an intermediate product on which the second leveled layer 16 and the like have been formed, is placed in a film forming chamber (not illustrated). Then, in a state in which a carbon tetrafluoride (CF4) gas, for example, is supplied to the interior of the film forming chamber described above, the liquid repellent layer 17 using fluorine is formed so as to cover the first leveled layer 14, the inorganic layer 15, and the second leveled layer 16 by performing plasma treatment using microwaves or plasma waves.

Further, the liquid repellent layer 17 is configured to have a thickness of 100 nm or greater, for example. In addition, in the process for forming a liquid repellent layer, using microwaves is preferable to using plasma waves, from the viewpoint of being able to efficiently form the liquid repellent layer 17 having excellent barrier properties (water repelling properties).

With the above configuration, in the present embodiment, the same operations and effects can be obtained as those of the first embodiment. Specifically, in the present embodiment, the liquid repellent layer 17 is provided covering the first leveled layer 14, the inorganic layer 15, and the second leveled layer 16, and thus, the permeation of moisture present on the outside of the organic EL display device 1 can be inhibited to the utmost extent.

Note that all of the embodiments described above are simply examples and in no way limit the present invention. A technical range of the present invention is prescribed by the scope of the claims, and all changes that are within an equivalent range of the configurations described therein are also included in the technical range.

For example, in the above description, a case is described in which the organic EL element is used as the electroluminescent element, but the present invention is not limited to this example, and an inorganic EL element having an inorganic compound may be used, for example.

Further, in the above description, a configuration is described in which the first leveled layer, the inorganic layer, and the second leveled layer are provided, but it is sufficient that the present invention include the first leveled layer, the inorganic layer, and the second leveled layer and that the first and second leveled layers be configured by diisocyanate, and the present invention may have a configuration in which another inorganic layer is provided on the second leveled layer, for example.

Additionally, in the above description, a case is described in which the aspect of the present invention is applied to the active-matrix organic EL display device having the thin film transistor (TFT) 7, but the present invention is not limited to this example, and may be applied to a passive-matrix organic EL display device that is not provided with the thin film transistor.

Further, in the above description, a case is described in which the aspect of the present invention is applied to the organic EL display device, but the present invention is not limited to this example, and may also be applied to an illumination device, such as a backlight device, for example.

INDUSTRIAL APPLICABILITY

The present invention is useful for an electroluminescent device offering excellent reliability that can improve barrier properties for an electroluminescent element and can significantly suppress the occurrence of deterioration in the electroluminescent element caused by moisture, and for a production method for the electroluminescent device.

REFERENCE SIGNS LIST

1 Organic EL display device
2 TFT substrate (substrate)
4 Organic EL element (electroluminescent element)
14 First leveled layer
14b Peripheral portion
15 Inorganic layer
16 Second leveled layer
17 Liquid repellent layer

The invention claimed is:

1. An electroluminescent device comprising:
a substrate;
a foundation film provided on the substrate;
a thin film transistor and a wire provided on the foundation film;
an interlayer insulating film provided covering the thin film transistor and the wire;
an electroluminescent element provided on the substrate;
a first leveled layer provided covering the electroluminescent element;
an inorganic layer provided on the first leveled layer; and
a second leveled layer provided on the inorganic layer,
wherein the first leveled layer and the second leveled layer are configured by diisocyanate,
the electroluminescent element includes a first electrode, an edge cover provided on the interlayer insulating film and covering an end portion of the first electrode, an organic electroluminescent layer, and a second electrode,
the second electrode contacts with a side face of the interlayer insulating film and a side face of the edge cover, and
the first leveled layer contacts with a top face of the second electrode and a side face of the second electrode.

2. The electroluminescent device according to claim 1, wherein a liquid repellent layer is provided covering the first leveled layer, the inorganic layer, and the second leveled layer.

3. The electroluminescent device according to claim 2, wherein fluorine is used in the liquid repellent layer.

4. The electroluminescent device according to claim 2, wherein there is a plurality of the electroluminescent elements,
the plurality of the electroluminescent elements configures a pixel area, and
the first leveled layer contacts with the foundation film on an outer side of the pixel area.

5. The electroluminescent device according to claim 4, wherein the liquid repellent layer contacts with a side face of the first leveled layer, a side face of the inorganic layer, a side face of the second leveled layer on the outer side of the pixel area.

6. The electroluminescent device according to claim 5, wherein the liquid repellent layer contacts with the foundation film on the outer side of the pixel area.

7. The electroluminescent device according to claim 1, wherein a thickness of a peripheral portion of the first leveled layer is not less than 1000 nm.

8. The electroluminescent device according to claim 1, wherein a thickness of the inorganic layer is not less than 100 nm.

9. The electroluminescent device according to claim 1, wherein a thickness of the second leveled layer is not less than 1000 nm.

10. A method for producing an electroluminescent device that includes a substrate and an electroluminescent element provided on the substrate, the method comprising:
    forming a foundation film over the substrate,
    forming a thin film transistor and a wire over the foundation film,
    forming an interlayer insulating film over the thin film transistor and the wire,
    forming a first electrode over the interlayer insulating film,
    forming an edge cover over the interlayer insulating film and the first electrode, the edge cover covering an end portion of the first electrode,
    forming an organic electroluminescent layer over the first electrode,
    forming a second electrode over the organic electroluminescent layer,
    forming a first leveled layer covering the electroluminescent element, the first leveled layer being configured by diisocyanate;
    forming an inorganic layer on the first leveled layer; and
    forming a second leveled layer on the inorganic layer, the second leveled layer being configured by diisocyanate, wherein
    the second electrode contacts with a side face of the interlayer insulating film and a side face of the edge cover, and
    the first leveled layer contacts with a top face of the second electrode and a side face of the second electrode.

11. The method for producing the electroluminescent device according to claim 10, further comprising:
    forming a liquid repellent layer covering the first leveled layer, the inorganic layer, and the second leveled layer, after the forming a second leveled layer.

12. The method for producing the electroluminescent device according to claim 11,
    wherein, the forming a liquid repellent layer includes forming a liquid repellent layer using fluorine by using one of microwaves and plasma waves.

* * * * *